United States Patent [19]

Marchió et al.

[11] Patent Number: 5,635,822
[45] Date of Patent: Jun. 3, 1997

[54] SAFEGUARD FOR INTEGRATED POWER STAGES EMPLOYING MULTIPLE BOND-WIRES TO A CURRENT LEAD OF THE PACKAGE

[75] Inventors: Fabio Marchió, Sedriano; Alessio Pennisi, Milan, both of Italy

[73] Assignee: SGS-Thomson Microelectronics, S.R.L., Agrate Brianza, Italy

[21] Appl. No.: 454,648

[22] Filed: May 31, 1995

[30] Foreign Application Priority Data

Jun. 24, 1994 [EP] European Pat. Off. .............. 94830319

[51] Int. Cl.⁶ ................................................. H01L 27/02
[52] U.S. Cl. ............................................................ 323/273
[58] Field of Search ................................. 357/41, 46, 42, 357/25, 26, 28, 40, 23, 4, 38, 23.1; 307/303.1; 323/273

[56] References Cited

U.S. PATENT DOCUMENTS 5,034,796  7/1991  Zommer ..................................... 357/41

FOREIGN PATENT DOCUMENTS

| 0280514 | 8/1988 | European Pat. Off. . |
| 0464751 | 8/1992 | European Pat. Off. . |
| 0540926 | 12/1993 | European Pat. Off. . |
| 4163932 | 6/1992 | Japan . |

*Primary Examiner*—Aditya Krishnan

[57] ABSTRACT

The functioning of a simple voltage regulator loop of an integrated power stage employing a plurality of bond-wires is ensured by realizing a conductive path connecting said pads to each other having a resistance lower by at least two orders of magnitude than the resistance of a voltage sensing divider of the regulation loop. Eventual ruptures of any of the bond-wires remain detectable through a final testing of the integrated circuit.

17 Claims, 2 Drawing Sheets

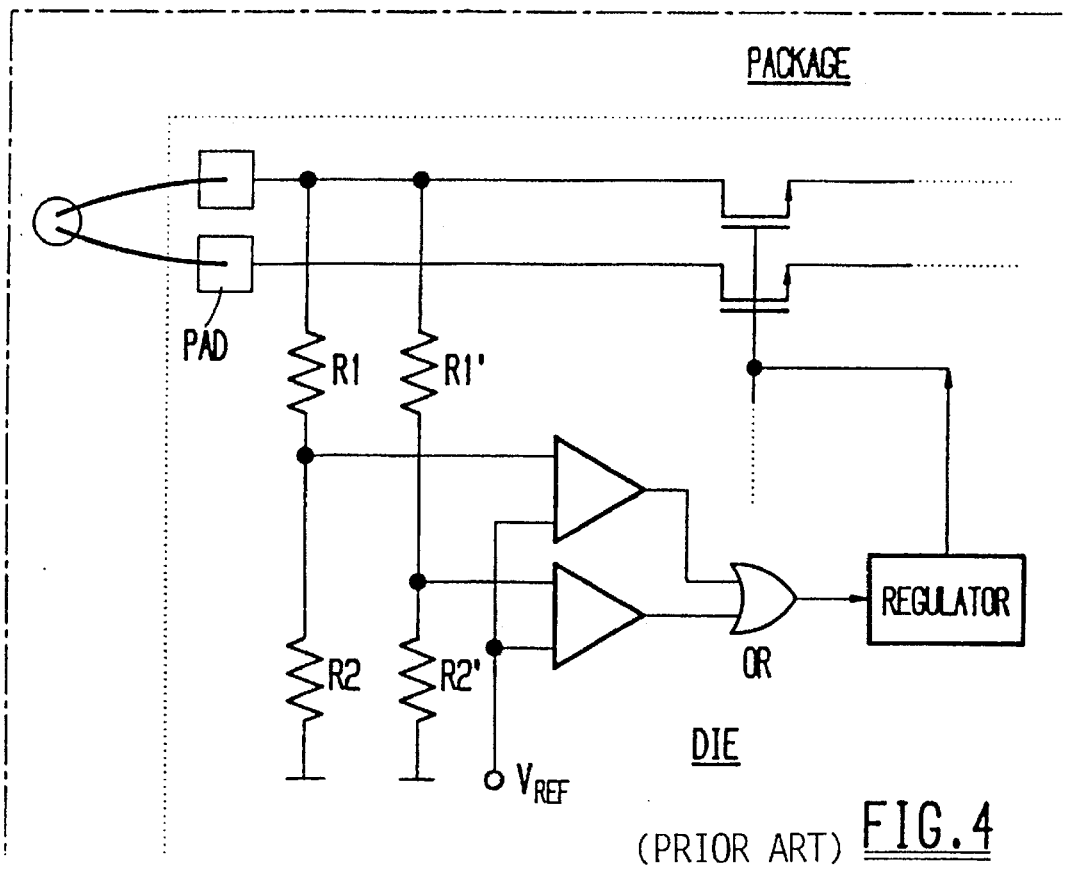
(PRIOR ART) FIG.4
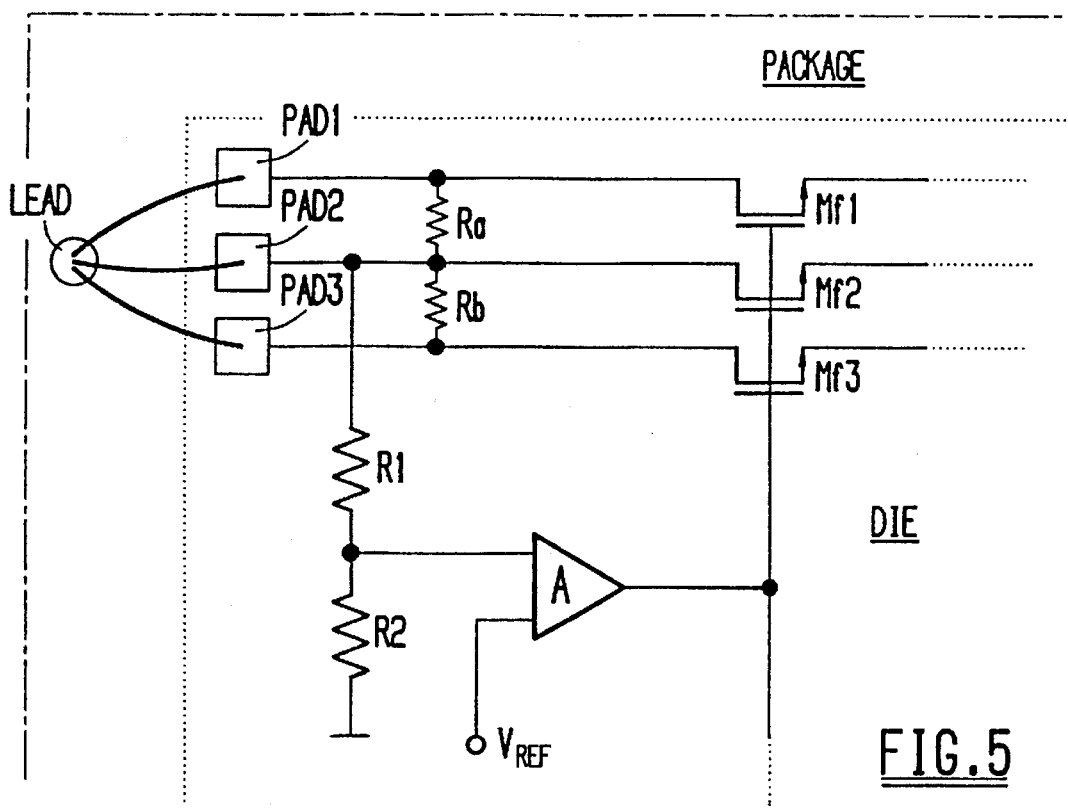
FIG.5

SAFEGUARD FOR INTEGRATED POWER STAGES EMPLOYING MULTIPLE BOND-WIRES TO A CURRENT LEAD OF THE PACKAGE

FIELD OF THE INVENTION

The present invention relates to a circuit arrangement for safeguarding the integrity of an output power device in case of accidental breaking of one or more bond-wires of a lead of the package.

BACKGROUND OF THE INVENTION

The constant progress of integration technologies has permitted the integration of an output power stage on the same chip containing the driving circuit and the circuit for controlling the operation of the output power device. By virtue of constant improvement of the technology, the level of current that may be delivered by an integrated power stage is continuously increasing. As a consequence, the diameter of the bond-wire used for connecting a pad of the integrated circuit with the respective lead of the package has also increased up to the limit of compatibility with the peculiar bonding techniques that are used for welding the wire on the metallized pad of the integrated circuit and on the inner end of the relative lead or pin of the package.

With the growing of design currents above the limit that can be safely handled by a single bond-wire of a relatively augmented diameter notwithstanding (especially for the nominal short circuit current), it becomes necessary to employ a second or a plurality of bond-wires in parallel with each other. A second bond-wire may be connected, as the first one, to a single pad of sufficient size, as shown in the diagram of FIG. 1. This solution has the drawback that in case of rupture of one or more bond-wires between the pad and the relative lead of the package, for example during the critical resin encapsulation phase of fabrication, the routine test of the end product will not detect the rupture, and during normal operation, the device may be subject to failure in case of overcurrent.

To obviate this problem, a known technique is to subdivide the power device into n modular devices, functionally driven in parallel with each other (where the number n may depend on the design current). Each current terminal of each modular power element may be connected to a respective pad, which is then connectable through a bond-wire to a single metal lead or pin of the package. The n pads altogether constitute a current terminal of the modularly integrated power device.

During final testing of the finished product, the modular power element is turned on and its series resistance is measured. An anomalous resistance value, higher than the expected value of the overall series resistance, will indicate the interruption of one or more of the n current paths, most probably due to the rupture of the relative bond-wire.

On the other hand, most output power stages have special control circuits which, for example, may include a regulator circuit of the output voltage. The voltage regulator generally employs an integrated voltage divider (R1-R2) connected to an output pad to sense an output voltage, as depicted in FIG. 3.

In case of rupture of the bond-wire that connects the pad through which the sensing voltage divider is connected to the relative lead, the voltage regulator will react as if the output voltage would be low, and therefore, will bring the output of the regulator to the input voltage.

This event has a dramatic effect in the case of a regulator for an alternator where, as a consequence of the behaviour of the voltage regulator circuit, the excitation will no longer be interrupted, thus causing the destruction of the battery.

In order to obviate to this risk, a known solution is to realize more sensing voltage dividers (one for each output pad), and as many loops or regulating circuits and a logic OR circuit capable of interrupting field excitation when anyone of the regulating loops rises above a reference voltage.

As schematically depicted in FIG. 4, this approach is used in many known systems, wherein the realization of a pair of resistances, an operational amplifier, and a capacitance of about 1 nanofard, necessary for implementing each regulating loop, do not materially burden the cost of the overall system. On the other hand, in many fully integrated systems, a solution of this type may be extremely burdensome and substantially inapplicable.

OBJECT AND SUMMARY OF THE INVENTION

There is, therefore the need and/or utility for a voltage regulator circuit of an integrated power stage employing a plurality of bond-wires between an identical number of pads of a generic current terminal, to one of which a voltage sensing network is connected, and a single metal lead or pin of the package, capable of functioning also in case of an eventual rupture of a bond-wire between said pad and the lead of the package.

The requirement of ensuring functionality of the voltage regulating loop in presence of an interruption of one or more of the bond-wires of a current terminal to which is functionally associated a voltage sensing device or network (commonly a resistive voltage divider) is satisfied by the circuit arrangement object of the present invention, which consists in realizing an electrical connection between the distinct pads, within the integrated circuit itself.

Such a connection between the distinct pads may have a practically negligible resistance up to a resistance of several hundreds ohms. In any case, the resistance of connection between the homologous pads should be at least two orders of magnitude lower than the value of the resistances that form the sensing voltage divider, which is connectable to any one of the distinct pads and more preferably to an "intermediate" pad.

In practice, the electrical connection may be implemented through the same metal of the pads or, in case of an output power device made in a modular form, the distinct transistors (modules) that compose the power element may be realized within the same tub of an epitaxial layer. In the case of a junction-isolation architecture of the integrated circuit, a connection between the different pads, having a sufficiently low resistance (on the order of ten of ohms), may be constituted, at least partially, by a continuous buried layer of all the transistor modules contained within the same tub.

The low resistance connection of the various pads with each other permits the correct functioning of a single voltage regulating loop in case the bond-wire of the pad to which the sensing voltage divider is connected is accidentally broken.

According to a different aspect of the invention, the connection between the different pads may have a resistance at least double the series resistance of the respective transistor module forming the modular output power element, though remaining substantially smaller by at least two orders of magnitude than the value of the resistances that compose the voltage sensing divider. This ensures the detectability of eventual ruptures of one or more bond-wires when testing the integrated device.

In this way, the safeguard arrangement of the invention satisfies both the requisite of detectability of ruptures during final testing of the integrated circuits, as well as of ensuring functionality of a single regulating loop in presence of an interruption of the relevant bond-wire.

BRIEF DESCRIPTION OF THE DRAWINGS

The different aspects and advantages of the invention will become even more evident through the following description of some important embodiments and by referring to the annexed drawings, wherein:

FIGS. 1, 2, 3, and 4 show different known solutions already discussed above;

FIG. 5 is a partial diagram showing the circuit arrangement of the invention.

DESCRIPTION OF PREFERRED EMBODIMENTS

Figure 1:
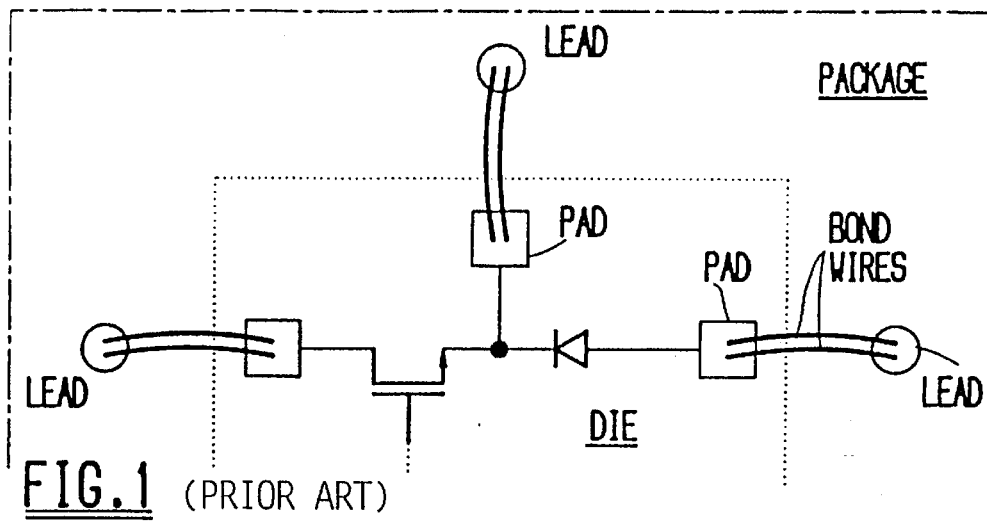
Figure 2:
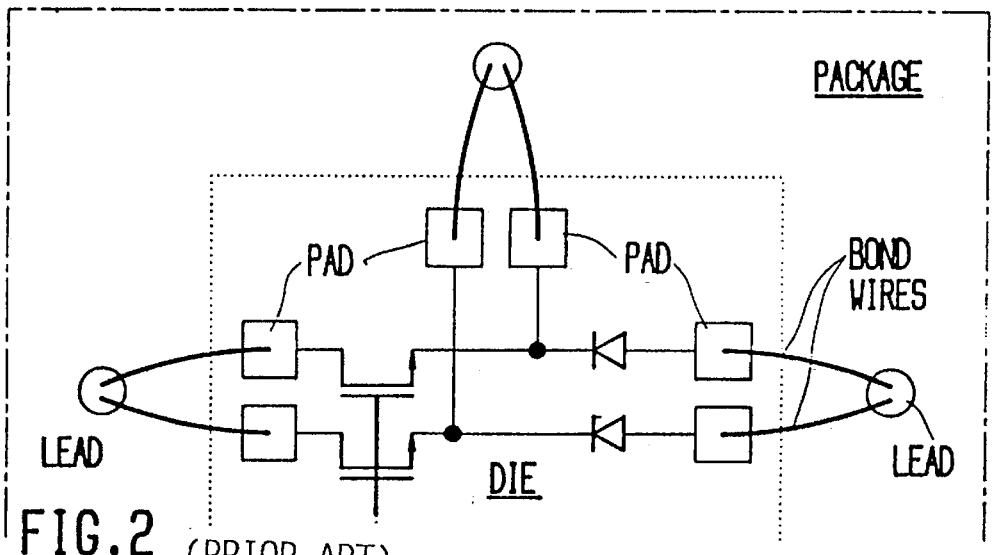
Figure 3:
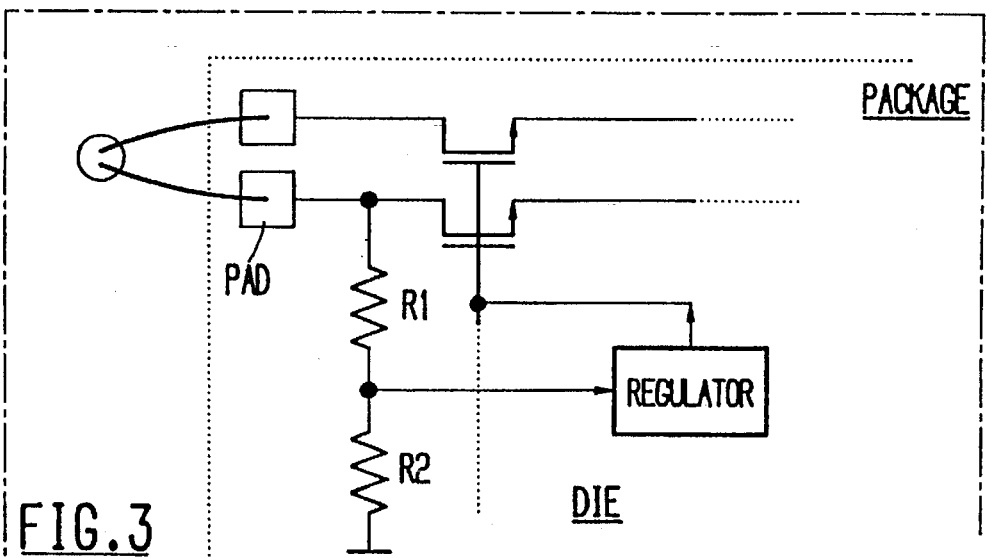

FIG. 5 schematically shows the circuit arrangement of the invention as applied to an output power stage using a modular power transistor, which is shown composed of three distinct identical transistors: Mf1, Mf2, and Mf3, driven in parallel.

The drain of each of the fractionary size transistors (modules) is connected to a respective output pad, namely: pads 1, 2, and 3. Each pad is connected by a bond-wire to a single lead or pin of the package.

A regulating loop may be functionally composed by a sensing voltage divider R1-R2, an operational amplifier A, and a reference voltage source $V_{ref}$.

Typically, the resistances R1 and R2 that form the sensing voltage divider may have a value of several hundred Kiloohms.

According to the present invention, the distinct pads are connected to each other through the resistances: Ra and Rb of a value that is lower by at least two orders of magnitude than the value of the resistances R1-R2 that form the sensing voltage divider of the regulating loop.

As already said above, the value of the resistances Ra and Rb that connect the pads may also be substantially null, that is, the connection between the distinct pads may be realized through the same metal of the pads. However such an embodiment will not permit detection of an accidental rupture of one or more bond-wires that connect the pads to the respective lead, during a final testing of the integrated circuit.

According to a preferred embodiment of the device of the invention, each connection path between the pads has a resistance (Ra and Rb) that may be comprised between a minimum limit that can be established as being at least double the series resistance (Rson) of the fractionary transistors Mf1, Mf2, and Mf3 (for example 10 ohms), when they are conducting, and a maximum limit that may be of several hundred ohms (for example 500 ohms), though remaining at least two orders of magnitude lower than the value of the resistances R1 and R2 that compose the sensing voltage divider of the output voltage regulating loop.

According to this preferred embodiment, it is possible to detect an accidental rupture of one or more bond-wires during final testing by observing an incrementally increased series resistance of the output power element and simultaneously ensuring a correct operation of the regulating circuit in case the bond-wire that connects the pad (pad 2) to which the sensing voltage divider R1-R2 is connected is accidentally broken. This prevents destructive effects that may be caused by a missed intervention of the output voltage regulating loop.

Practically, the precision of the output voltage regulator is not altered in any substantial manner upon an accidental breaking of the bond-wire of the pad 2, because the resistance of the connection path to the output of the circuit will remain relatively small (RaRb/Ra+Rb) and such as not to alter in any significant amount the ratio R1/R2.

Of course, in case of more than two homologous pads, for example three, as in the example shown in FIG. 5, it will be advantageous to connect the sensing voltage divider R1-R2 to the "central" or "intermediate" pad. In case of simultaneous breaking of more than one bond-wire, the equivalent resistance of the series-parallel combination of the resistances of the connection paths between the pads and the lead of the package that remain integral, and which is consequently placed in series with the resistance R1 of the sensing voltage divider, must remain sufficiently low so as not to alter significantly the design ratio R1/R2.

We claim:

1. A voltage regulator for a current terminal of an integrated power stage, comprising:

a plurality of bond-wires between an equal number of pads of the integrated circuit;

a single current lead of the package of the integrated circuit connected to said plurality of bond-wires; and a single regulating loop comprising a comparator and a sensing voltage divider functionally connected to at least one of said pads;

wherein a connection path between said pads has a resistance of at least two orders of magnitude lower than the value of the resistances composing said sensing voltage divider.

2. The voltage regulator of claim 1, wherein said power stage is realized with a plurality of parallel integrated power devices controlled by said single regulating loop, each having a current terminal connected to one of said pads.

3. The regulator of claim 2, wherein said resistance of said connection path has a minimum value double the series resistance of said parallel power devices in a conducting state and a maximum value lower by at least two orders of magnitude than the value of the resistances that form said sensing voltage divider.

4. The regulator of claim 2, wherein said resistance is between 10 and 500 ohm.

5. A safeguard system for an integrated circuit, comprising:

a power stage employing a plurality of bond wires between an equal number of pads of a current terminal of said power stage of the integrated circuit;

a single metal lead of the package of the integrated circuit connected to said pads; and a single regulating loop of the output voltage composed by at least a voltage divider connected to one of said pads, said pads being connected to each other through a conducting path having a resistance lower by at least two orders of magnitude than the value of the resistances that compose said voltage divider.

6. A voltage regulator comprising:

a current lead connection;

a plurality of bond-wires each connected between said lead connection and a respective bond pad;

at least one sensing voltage divider, having first and second divider resistances, connected to at least one of said bond pads;

at least one connection path resistance connected between said bond pads; and a comparator connected to said voltage divider.

7. The regulator of claim 6, wherein the resistance of said connection path resistances is at least two orders of magnitude lower than the resistance of said first and second divider resistances.

8. A regulated power stage comprising:

a plurality of paralleled integrated power devices;

a current lead connection;

a plurality of bond-wires each connected between said lead connection and a respective bond pad;

at least one sensing voltage divider, having first and second divider resistances, connected to at least one of said bond pads;

at least one connection path resistance connected between said bond pads; and a comparator connected to said voltage divider, a reference potential, and each of said power devices.

9. The regulated power stage of claim 8, wherein the resistance of said connection path resistances is at least two orders of magnitude lower than the resistance of said first and second divider resistances.

10. The regulated power stage of claim 8, wherein the resistance of said connection path resistances is between 10 and 500 ohms.

11. An integrated circuit voltage regulator comprising:

an output lead, and control pads of which multiple ones are connected to said output lead by bond wires, each said pad having a power transistor connected thereto;

a voltage regulator having a voltage divider connected to one said pad and to ground and having a differential amplifier connected to control said power transistors; and additional resistors connecting said pads together, each said additional resistor having less than one-one hundredth of the resistance of said voltage divider.

12. A method for assembling and testing a voltage regulator, comprising the steps of:

providing a voltage regulator which comprises a voltage divider connected to an output pad, and a differential amplifier connected to derive a control signal from comparison of an intermediate node of said voltage divider with a reference voltage and accordingly control multiple power transistors;

said multiple power transistors each being connected to drive current at a respective contact pad;

ones of said contact pads being mutually interconnected by resistors which are each at least two orders of magnitude smaller than the value of said voltage divider.

13. The voltage regulator of claim 1, including at least three said pads.

14. The safeguard system of claim 5, including at least three said pads.

15. The voltage regulator of claim 6, including at least three said pads.

16. The regulated power stage of claim 8, including at least three said pads.

17. The integrated circuit of claim 11, including at least three said pads.

* * * * *